(12) United States Patent
Huffer et al.

(10) Patent No.: US 6,701,605 B2
(45) Date of Patent: Mar. 9, 2004

(54) CONDUCTIVE ELECTRICAL ELEMENT AND ANTENNA WITH INK ADDITIVE TECHNOLOGY

(75) Inventors: Scott W. Huffer, Hartsville, SC (US); Jeffrey M. Schuetz, Florence, SC (US); James Lowry, Florence, SC (US)

(73) Assignee: Sonoco Development, Inc., Hartsville, SC (US)

( * ) Notice: Subject to any disclaimer, the term of this patent is extended or adjusted under 35 U.S.C. 154(b) by 193 days.

(21) Appl. No.: 09/973,494

(22) Filed: Oct. 9, 2001

(65) Prior Publication Data

US 2003/0067415 A1 Apr. 10, 2003

(51) Int. Cl.$^7$ .................. G06K 19/077; H05K 1/09
(52) U.S. Cl. ...................................... 29/601
(58) Field of Search .................. 29/601; 428/211, 428/343, 195, 157, 141, 40.2; 359/567, 2, 15; 362/144

(56) References Cited

U.S. PATENT DOCUMENTS

| | | |
|---|---|---|
| 1,509,664 A | 9/1924 | Brown |
| 2,793,585 A | 5/1957 | Granitsas ............... 101/28 |
| 3,134,892 A | 5/1964 | Opitz et al. ............ 219/69 |
| 3,647,959 A | 3/1972 | Schlesinger et al. ...... 178/7.87 |
| 3,750,117 A | 7/1973 | Chen et al. ........... 340/173 LS |
| 3,811,915 A | 5/1974 | Burrell et al. ........... 117/45 |
| 3,859,110 A | 1/1975 | Foster et al. ........... 117/27 |
| 4,079,673 A | 3/1978 | Bernstein ............... 101/426 |
| 4,124,947 A | 11/1978 | Kuhl et al. ............ 40/453 |
| 4,184,700 A | 1/1980 | Greenaway ............. 283/6 |
| 4,269,473 A | 5/1981 | Flothmann et al. ...... 350/3.61 |
| 4,329,409 A | 5/1982 | Wreede et al. ........... 430/1 |
| 4,330,604 A | 5/1982 | Wreede et al. ........... 430/2 |
| 4,748,452 A | 5/1988 | Maurer ................. 346/1.1 |
| 4,758,296 A | 7/1988 | McGrew ................ 156/231 |
| 4,759,982 A | 7/1988 | Jenssen et al. .......... 428/343 |
| 4,842,633 A | 6/1989 | Kuribayashi et al. ....... 65/44 |
| 4,856,857 A | 8/1989 | Takeuchi et al. .......... 350/3.6 |
| 4,857,425 A | 8/1989 | Phillips ................ 430/1 |
| 4,898,648 A | 2/1990 | Cusano ................ 204/15 |
| 4,908,063 A | 3/1990 | Baker et al. ............ 106/31 |
| 4,908,740 A | 3/1990 | Hudgins et al. .......... 362/144 |
| 4,933,120 A | 6/1990 | D'Amato et al. ......... 264/13 |
| 4,933,218 A | 6/1990 | Longobardi ............ 428/38 |
| 4,970,129 A | 11/1990 | Ingwall et al. ........... 430/1 |
| 4,973,656 A | 11/1990 | Blount ................. 528/272 |
| 5,003,915 A | 4/1991 | D'Amato et al. ......... 118/46 |
| 5,005,872 A | 4/1991 | Lass et al. ............. 283/85 |
| 5,008,144 A | 4/1991 | Baker et al. ............ 428/211 |
| 5,013,494 A | 5/1991 | Kubo et al. ............ 264/1.3 |
| 5,019,202 A | 5/1991 | Kawahata et al. ........ 156/277 |
| 5,058,992 A | 10/1991 | Takahashi .............. 359/567 |
| 5,085,514 A | 2/1992 | Mallik et al. ............ 359/2 |
| 5,106,126 A | 4/1992 | Longobardi et al. ....... 283/94 |

(List continued on next page.)

FOREIGN PATENT DOCUMENTS

| | | |
|---|---|---|
| EP | 0569640 A | 11/1993 |
| EP | 0974626 A | 1/2000 |
| EP | 1014302 A | 6/2000 |
| EP | 1022151 A | 7/2000 |
| JP | 55-146785 | 11/1980 |
| WO | WO 00/37258 | 6/2000 |

Primary Examiner—James Clinger
(74) Attorney, Agent, or Firm—Drinker Biddle & Reath LLP

(57) ABSTRACT

A printing process is provided in which a conductive ink is printed over a printed pattern formed by a coating having an additive that lowers surface tension. Printed electrical elements and antennae (including RFID antennae) are formed using this process. The coating with the surface tension lowering additive is printed on a substrate in a predetermined pattern. A conductive ink is then applied over the coating and, because of the difference in surface tension between the coating and the substrate, the ink flows away from the coating. The conductive ink dries between the printed coating pattern and forms the conductive element.

27 Claims, 3 Drawing Sheets

U.S. PATENT DOCUMENTS

| | | | |
|---|---|---|---|
| 5,116,548 A | 5/1992 | Mallik et al. | 264/1.3 |
| 5,122,813 A | 6/1992 | Lass et al. | 346/1.1 |
| 5,304,411 A | 4/1994 | Rusincovitch, Jr. | 428/141 |
| 5,330,799 A | 7/1994 | Sandor et al. | 427/510 |
| 5,401,303 A | 3/1995 | Stoffel et al. | 106/20 R |
| 5,505,320 A | 4/1996 | Burns et al. | 216/13 |
| 5,538,674 A | 7/1996 | Nisper et al. | 264/1.31 |
| 5,539,440 A | 7/1996 | Higuchi et al. | 347/112 |
| 5,554,432 A | 9/1996 | Sandor et al. | 428/157 |
| 5,633,735 A | 5/1997 | Hunter, Jr. et al. | 359/15 |
| 5,639,391 A | 6/1997 | Person | 219/121.68 |
| 5,654,782 A | 8/1997 | Morokawa et al. | 349/143 |
| 5,665,457 A | 9/1997 | Sato et al. | 428/195 |
| 5,716,682 A | 2/1998 | Lovison et al. | 428/30 |
| 5,742,432 A | 4/1998 | Bianco | 359/566 |
| 5,838,468 A | 11/1998 | Manako et al. | 359/15 |
| 5,944,356 A | 8/1999 | Bergmann et al. | 283/86 |
| 5,968,607 A | 10/1999 | Lovison | 427/511 |
| 5,982,545 A | 11/1999 | Su | 359/569 |
| 6,043,936 A | 3/2000 | Large | 359/572 |
| 6,066,378 A | 5/2000 | Morii et al. | 428/40.2 |
| 6,087,940 A | 7/2000 | Caperna et al. | 340/572.5 |
| 6,146,032 A | 11/2000 | Dunham | 400/120.18 |
| 6,147,662 A | 11/2000 | Grabau et al. | 343/895 |
| 6,222,157 B1 | 4/2001 | Langille et al. | 219/121.69 |
| 6,551,694 B1 | 4/2003 | Imamichi et al. | 428/195 |
| 2001/0002035 A1 | 5/2001 | Kayanakis | 235/492- |

CONDUCTIVE ELECTRICAL ELEMENT AND ANTENNA WITH INK ADDITIVE TECHNOLOGY

FIELD OF THE INVENTION

The present invention relates to a method forming an electrical element or antenna. More specifically, the present invention relates to a method for making an electrical element or antenna by printing a conductive ink over a pattern-printed coating.

BACKGROUND OF THE APPLICATION

Conductive inks are used for printing electrical elements, including antennae. In particular, conductive inks have been used to print antennae for radio frequency identification (RFID) tags. RFID tags are used to track inventory, confirm the validity of goods, and for other product tracking and identification purposes.

Printed ink electrical components can be less expensive to produce than their formed, stamped, or laser ablated counterparts. In addition, printed ink electrical components can be presented in an aesthetically pleasing manner. This is particularly important when considering the use of printed ink antennae for use in tracking retail goods, since the common retail tracking system uses a large unsightly tag, as opposed to the more decorative tag afforded by using a printed ink antenna.

One current problem with printed ink electrical elements is that the current printing technologies (using a screen-printing process) result in ink bleeding, which causes the conductive path in the element to short circuit. This problem is exaggerated for RFID antennae because a long uninterrupted conductive path in an RFID antenna provides a more powerful antenna; ink bleeding becomes more probable with this longer path. Thus there is a need for making long uninterrupted paths of printed conductive ink. The present invention provides a process for printing such paths of conductive ink, and also discloses using this process in antennae and RFID applications.

SUMMARY OF THE INVENTION

The present invention provides a printing process in which a conductive ink is printed over a coating having an additive that lowers surface tension. The coating with the surface tension lowering additive is pattern printed on a substrate in a predetermined pattern, and a conductive ink is then applied over the coating. Due to the difference in surface tension between the coating and the substrate, the ink flows away from the coating, forming the shape for a conductive element.

The conductive element may be an antennae or an RFID antennae.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

DETAILED DESCRIPTION OF THE DRAWINGS

Figure 1:
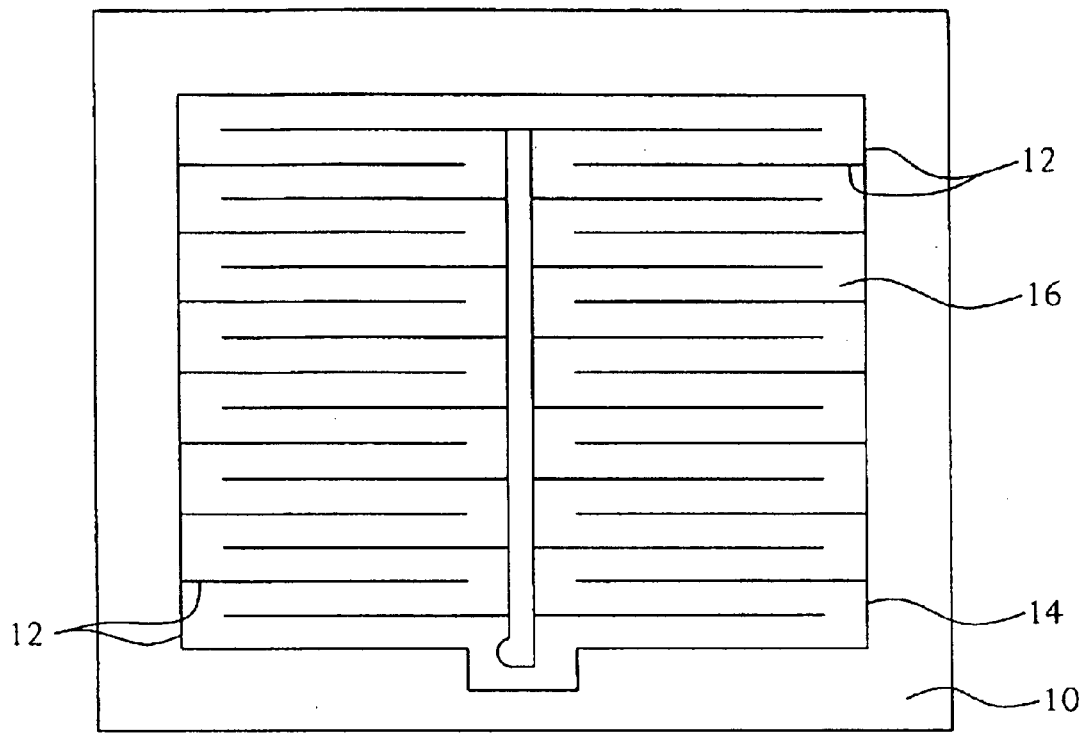
FIG. 1 is a top view of the coating pattern printed on a substrate.

In the drawings, where like numerals identify similar elements, there are shown different views of printed matter according to the present invention. FIG. 1 shows the additive enhanced coating 12 printed over the substrate 10 in a pattern suitable for an antenna, leaving spaces between adjacent lines of coating so that the substrate 10 remains exposed in the non-printed areas 16. The coating printed areas 12 are contained within the target zone 14 on the substrate 10. It should be understood that the target zone 14 could be the same size as the substrate 10 for some applications. The substrate is preferably a silicone chip.

Before printing, the coating is combined with an additive which lowers the surface tension of the dried coating. One such additive is a hydroxy-modified polyether silane manufactured and sold by BYK-Chemie. The coating is preferably a hydroxy-functional resin such as Acrylic 928–1663, although other resins or varnishes may perform equally as effectively or better than Acrylic 928–1663.

Figure 2:
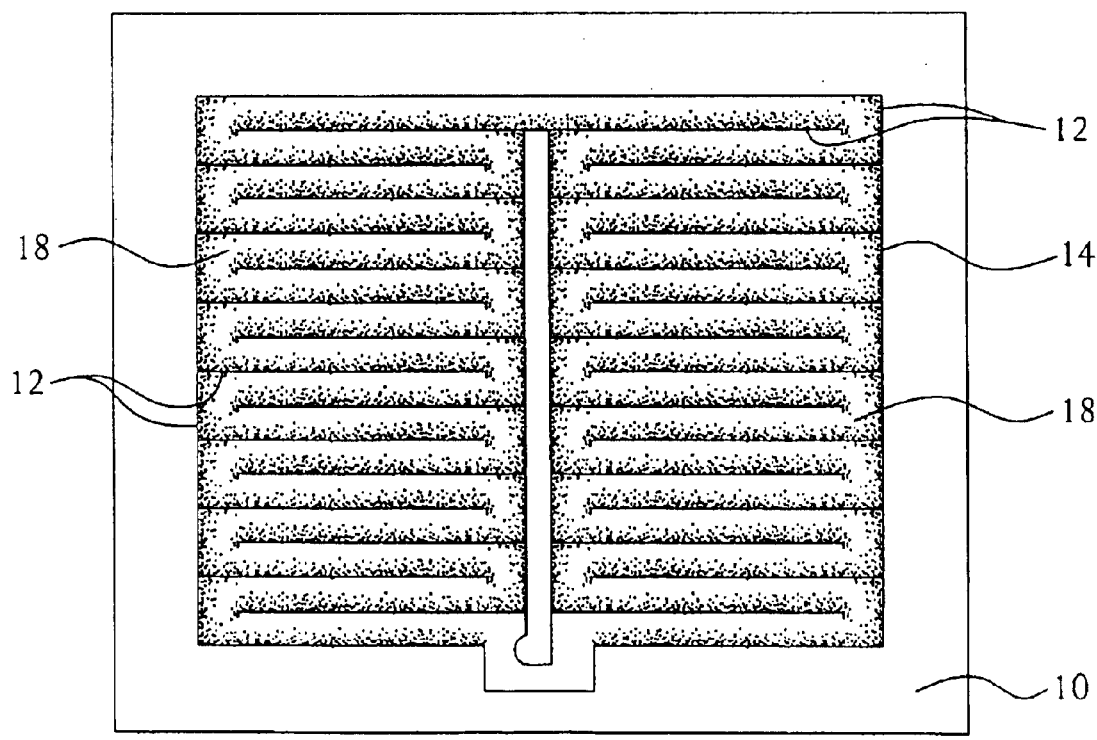
FIG. 2 is a top view of the conductive ink printed over the coating pattern of FIG. 1.
Figure 6:
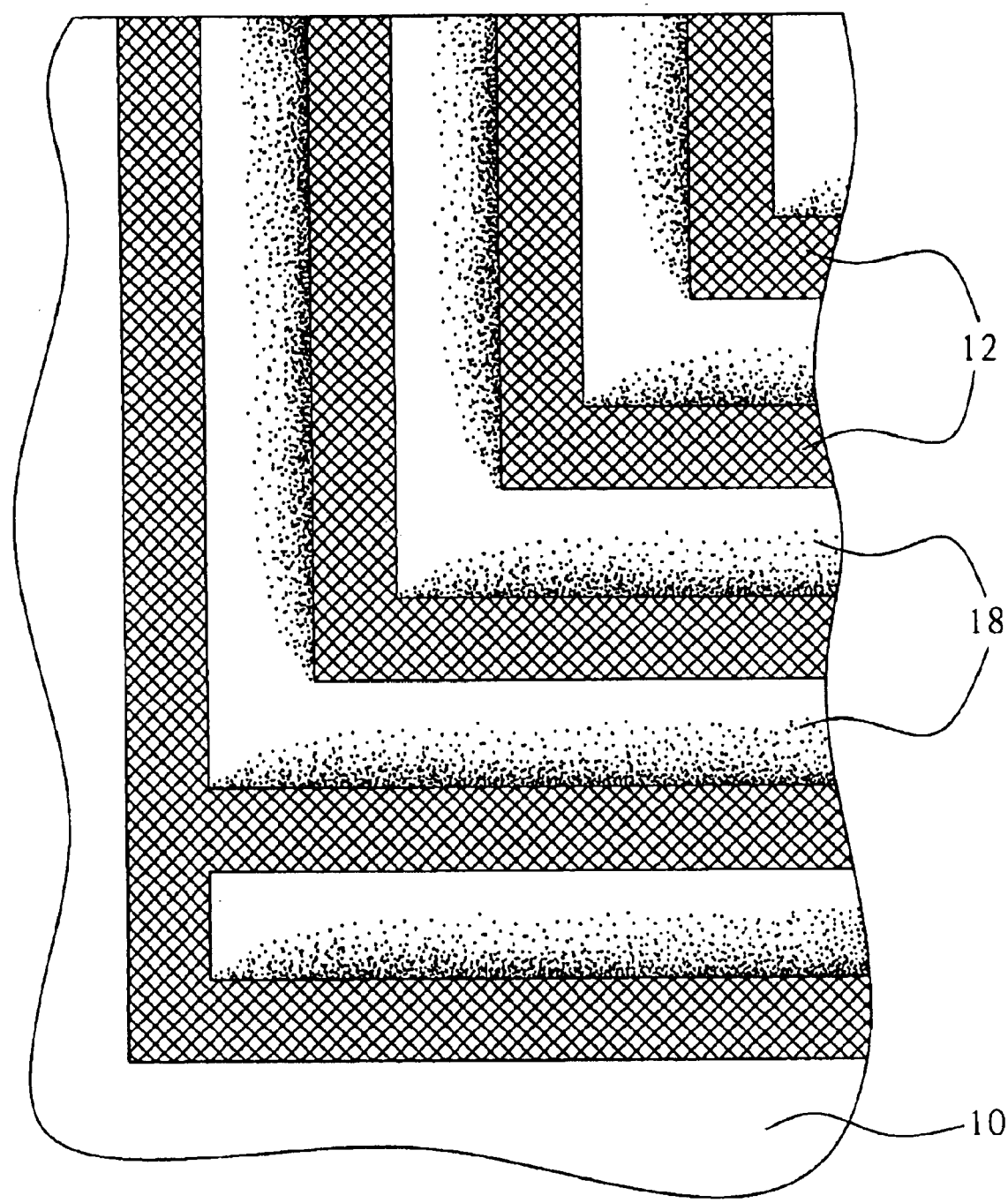
FIG. 6 is a partial enlarged section of a printed electrical component or antenna according to the present invention.

FIG. 2 shows the pattern printed coating 12 shown in FIG. 1 after the conductive ink 18 has been printed over the target zone 14. Because of the surface lowering additive in the coating 12, the conductive ink 18 flows away from the coating 12. FIG. 6 shows an unscaled enlarged partial section showing the coating with the ink printed thereon.

The particular printing method used to apply the conductive ink to the substrate is not important, and those of ordinary skill in the art will recognize that a variety of printing methods are available. One example of a suitable printing method is the rotogravure process. Rotogravure is preferable because it produces highly accurate images, while allowing for high press and production speeds. Rotogravure cylinders engraved by a laser engraver will yield both the production volume and continuous channels necessary to produce the desired continuous and high volume flow of conductive ink necessary to achieve an improved printed electrical element or antenna.

The laser engraver is capable of engraving deep continuous channels for the ink. Mechanical engraving with a diamond stylus will produce large cells with narrow channels of a much smaller volume.

It should be understood that with the use of a laser engraver, highly accurate patterns can be created. Also, more volume of the ink can be deposited on the surface due to the large volume of cells produced on the laser engraver. This large volume is possible with the present invention substantially without the occurrence of "flow outs" or bleeding. This bleeding of the conductive ink results in short outs in the antenna and may be more common in non-laser engraved printing processes.

Figure 3:
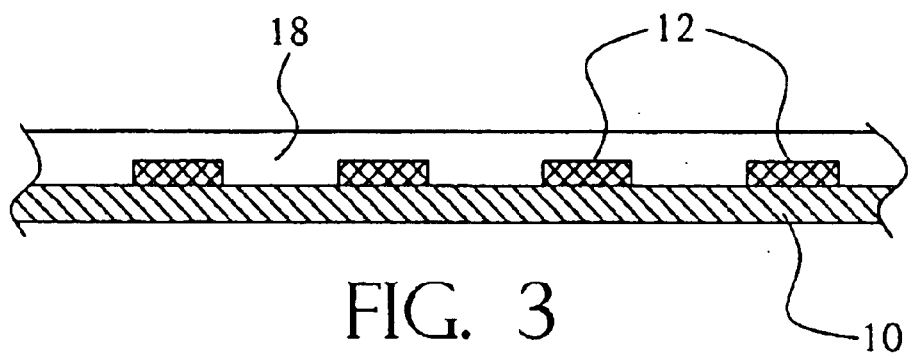
FIG. 3 is a cross section showing conductive ink applied over a pattern printed coating according to the present invention.
Figure 4:
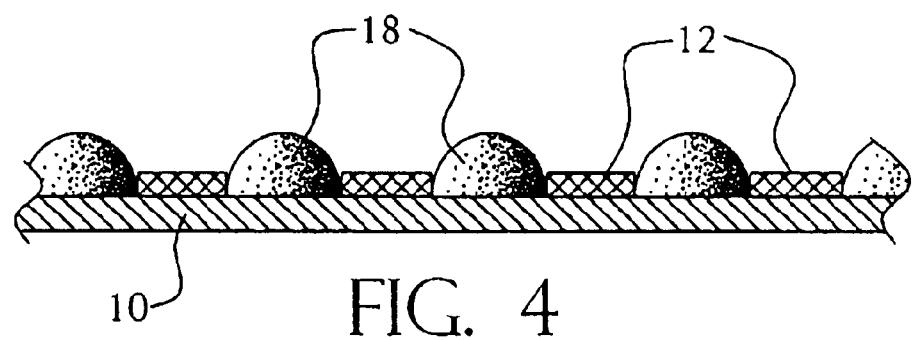
FIG. 4 is a cross section showing conductive ink which has flowed into the spaces between the pattern.

FIGS. 3 and 4 show the ink printing and flow in cross section. FIG. 3 is a cross section of the target zone immediately after the ink 18 has been applied. The ink 18 is in contact with both the printed, dried coating 12 and the substrate 10 between lines of coating 12. Because the surface tension of the dried coating 12 is lower than the surface tension of the substrate 10, the ink 18 flows away from the dried coating 12 and toward the areas of exposed substrate 10.

FIG. 4 shows a cross section of printed matter according to the invention after the ink 18 has completed its flow. The ink 18 has collected in the areas of exposed substrate 10 between the profile lines of coating 12. As shown, the ink 18 forms raised ridges that are oriented along the patterned lines of coating 12, though it would be recognized by one skilled in the art that with less ink, these ridges would be reduced or eliminated. The ink 18 dries between the lines of the coating pattern 12. Without the additive in the coating, the ink would normally flow out and dry in a continuous film (as shown in FIG. 3) and would not yield the continuous uninterrupted electrical element desired.

Figure 5:
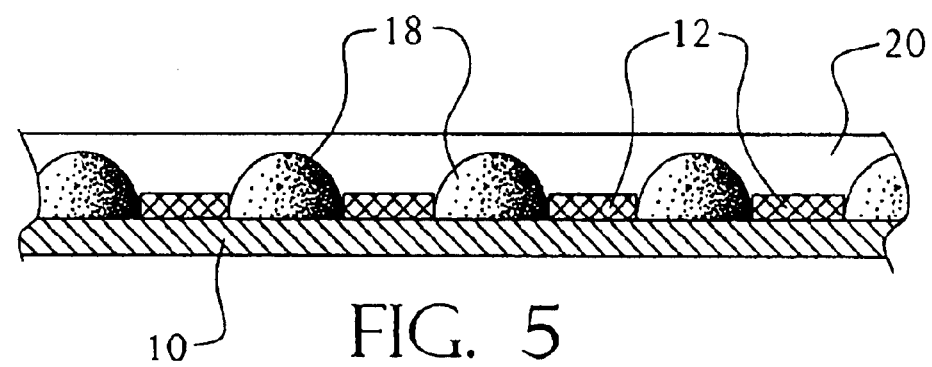
FIG. 5 is a cross section showing a protective coating applied over the pattern printed coating and conductive ink.

FIG. 5 shows a further embodiment of the invention of the application wherein a protective coating 20 is applied over the target zone 14 (although the protective coating could be applied over the entire substrate 10, if desired). This protective coating prevents damage to the electrical element or antenna contained within the target zone.

When using the above described process to form an RFID element, the RFID antenna would be connected to an RFID chip through a conductive material, such as a conductive epoxy. The manner of forming an RFID element using an RFID chip and antenna is described in U.S. Pat. No. 6,147,662 to Grabau et al., and is incorporated herein by reference.

The present invention may be embodied in still further specific forms using different inks, surface tension lowering additives, coatings, patterns for antennae, protective coatings, and substrates, without departing from the spirit or essential attributes thereof and, accordingly, reference should be made to the appended claims, rather than to the foregoing specification, as indicating the scope of the invention.

What is claimed is:

1. A process for making a conductive element comprising the steps of:
   providing a conductive ink;
   providing a coating;
   adding a surface tension lowering additive to the coating;
   pattern printing the coating onto a target zone on a substrate, the target zone having coating printed areas and non-printed areas, the non-printed areas forming the shape for the conductive element;
   applying the ink over the target zone; and
   allowing the ink to flow from the coating printed areas to the non-printed areas until the ink forms in the shape of the conductive element.

2. The process of claim 1 wherein the coating printed areas are printed such that non-printed areas are positioned between substantially parallel lines of printed coating.

3. The process of claim 1 wherein the coating is a hydroxy-functional resin.

4. The process of claim 3 wherein the resin coating is clear.

5. The process of claim 1 wherein the coating is a varnish.

6. The process of claim 1 wherein the coating is a pattern of colored inks.

7. The process of claim 1 wherein the additive is hydroxy-modified polyether silane.

8. The process of claim 1 wherein the substrate is a silicone chip.

9. The process of claim 1 wherein the printing of the conductive ink and the coating is performed using a laser engraved rotogravure printing machine.

10. The process of claim 1, further comprising a protective coating encapsulating the target zone.

11. The process of claim 1, further comprising the step of:
   providing a radio frequency identification chip, the radio frequency identification chip and the conductive element being in contact with each other through a conductive material.

12. The process of claim 11, further comprising a protective coating encapsulating the target zone.

13. The process of claim 11 wherein the additive is hydroxy-modified polyether silane.

14. The process of claim 11 wherein the printing of the conductive ink and the coating is performed using a laser engraved rotogravure printing machine.

15. The process of claim 11 wherein the conductive material is a conductive epoxy.

16. The process of claim 1 wherein the conductive element is a conductive epoxy.

17. A conductive element comprising:
   a coating having a surface tension lowering additive;
   a conductive ink; and
   a substrate having a target zone, the target zone having the coating and conductive ink printed thereon; the target zone having coating printed areas and ink printed areas, the coating printed areas forming a shape for the conductive element, the ink printed areas forming a pattern between the coating printed areas.

18. The conductive element of claim 17 wherein the pattern is an antenna.

19. The conductive element of claim 17 wherein the pattern is a radio frequency identification antenna.

20. The conductive element of claim 17, further comprising a protective coating encapsulating the target zone.

21. The conductive element of claim 17 wherein the additive is hydroxy-modified polyether silane.

22. The conductive element of claim 17 wherein the printing of the conductive ink and the coating is performed using laser engraved rotogravure.

23. A conductive element comprising:
   a conductive ink; and
   a coating including a surface tension lowering additive,
   the ink and coating printed on a substrate within a target zone having ink printed areas and coating printed areas, the ink printed areas located between the coating printed areas such that the ink forms a continuous electrical element.

24. The conductive element according to claim 23 wherein the coating printing areas comprise areas extending in the form of spaced parallel lines such that at least a portion of the continuous electrical element extends in a serpentine fashion.

25. The conductive element according to claim 24 wherein the coating printing areas comprise two sets of spaced parallel lines, the sets separated from each other by at least one coating printed area extending substantially perpendicular to the spaced parallel lines.

26. The conductive element according to claim 23 wherein the continuous electrical element is an antenna.

27. The conductive element according to claim 26 wherein the antenna is electrically connected to a radio frequency identification chip by a conductive material.

* * * * *